United States Patent [19]

Wolfe

[11] 4,024,478
[45] May 17, 1977

[54] PRINTED BROADBAND A. C. GROUNDED MICROWAVE TERMINATIONS

[75] Inventor: Allen Robert Wolfe, Sauquoit, N.Y.

[73] Assignee: General Electric Company, Utica, N.Y.

[22] Filed: Oct. 17, 1975

[21] Appl. No.: 622,922

[52] U.S. Cl. ............................... 333/1.1; 333/22 R
[51] Int. Cl.² ....................... H01P 1/38; H01P 1/26
[58] Field of Search ............... 333/22 R, 81 A, 1.1; 338/216, 295, 306, 307, 308, 309, 320

[56] References Cited

UNITED STATES PATENTS 3,521,201  7/1970  Veteran ........................... 333/81 A
3,753,161  8/1973  Iwakami ....................... 333/22 R X

*Primary Examiner*—Paul L. Gensler

[57] ABSTRACT

A.C. grounded termination networks having multi-octave bandwidth capacity are provided in printed rf circuit form (e.g., microstrip, stripline) by fabricating a distributed element network as a series of alternating resistor-conductor elements having different circuit parameters. The circuit parameters are computed using an "exhaustive search" procedure involving computer optimization of the chain matrix equivalent expression of the voltage reflection coefficient for the network.

2 Claims, 5 Drawing Figures

PRINTED BROADBAND A. C. GROUNDED MICROWAVE TERMINATIONS

BACKGROUND OF THE INVENTION

A number of different approaches have been utilized in the past to fabricate broadband termination circuits in the rf printed circuit (microstrip and stripline) art. One approach is to run a printed transmission line of the proper impedance through a transition circuit to a conventional coaxial cable termination. This use of an extra rf transition network and an external termination complicates the circuit fabrication process and adds to its expense. It also increases the size of the circuit package and limits its performance by the voltage standing wave ratio (VSWR) of the transition circuit. Another termination technique that has been found useful in narrowband applications has been the use of printed, low impedance quarter-wavelength open end stub circuits to capacitively ground a chip type or thin film resistor. It is also possible to make a capacitively grounded distributed termination by tapering a length of transmission line to zero width over a triangular resistive sheet which increases in width as the transmission line width decreases. This, however, is also an expensive approach since it requires tight control on the resistivity of the triangular resistor sheet. D.C. grounded resistors have also been employed as rf termination circuits and such circuits have been designed for single octave bandwidth performance through the use of two tuned transmission lines to compensate for the large amount of parasitic inductance associated with the grounding techniques. However, when an A.C. grounded resistive termination is required this approach cannot be used.

OBJECTS AND SUMMARY OF THE INVENTION

It is therefore an object of the present invention to provide a printed rf circuit A.C. grounded termination connection that has multi-otave bandwidth capacity.

Another object is to provide a broadband rf termination circuit of the type described which can be fabricated using only simple, inexpensive printed circuit techniques.

In accordance with the invention a broadband rf A.C. grounded termination circuit is provided by constructing a distributed element network in the form of an alternating series of resistor-conductor sections. The resistor and conductor sections have circuit parameters which provide an optimum voltage reflection coefficient response over the desired multi-octave frequency band.

These and other objects, features and advantages will be made apparent by the following detailed description of a preferred embodiment of the invention, the description being supplemented by drawings as follows:

DETAILED DESCRIPTION OF EMBODIMENT

Figure 1:
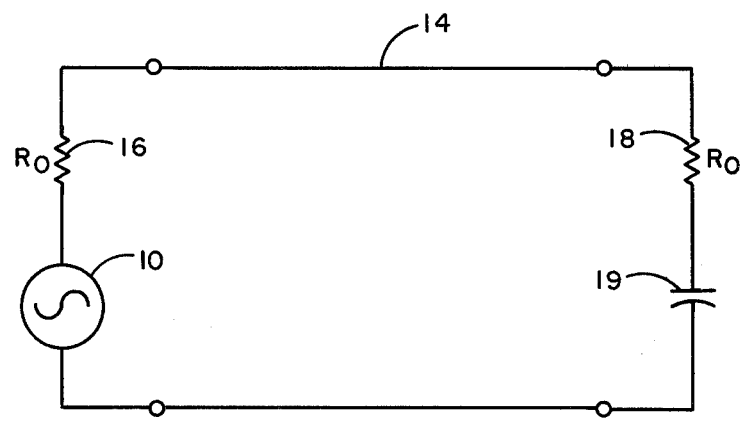
FIG. 1 is a schematic circuit diagram showing an A.C. grounded termination circuit.

As shown in FIG. 1, a source of rf energy 10 is connected by a transmission line 14 to a load 18. As is well known, the coupling of maximum energy between source 10 and load 18 requires that the load impedance be properly matched with the internal impedance of the source (shown as a resistor 16). As indicated, the impedances have an equal value $R_o$. If there is a mismatch, undesirable reflections of energy from the load back to the source will occur resulting in a loss of signal as seen at the load. These reflections can also have adverse effects on source 10 inasmuch as a large amount of reflection can result in excessive energy dissipation within the source itself. This can lead to overloading and thermal deterioration of the circuits within the source.

When an impedance mismatch is present at the load a resistive shunt termination can be added to the transmission line between the source and the load to absorb reflections generated due to the mismatch. For proper absorption of reflected energy the impedance of the termination must accurately match the source impedance. A.C. grounding of the termination, as opposed to a direct D.C. ground connection, is preferred in high frequency applications due to the large amount of parasitic inductance present at high frequencies in the usual types of D.C. ground terminals, e.g., plated-through holes and plated over-edges. Also, the need for the D.C. bias signal injection into the rf circuit may also dictate the need for an A.C. grounded termination.

Figure 2:
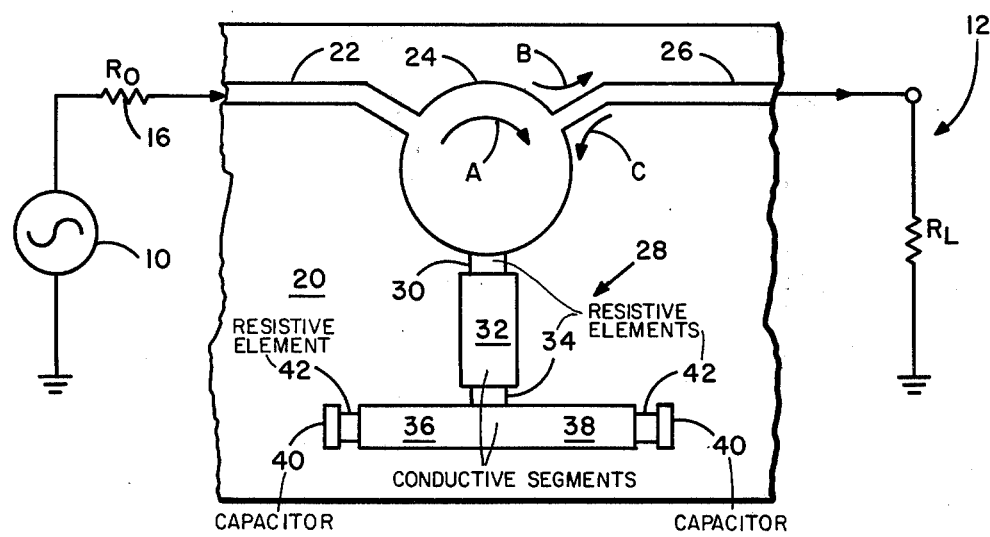
FIG. 2 is a partial schematic, partial plan diagram illustrating a preferred embodiment of a broadband rf A.C. termination circuit constructed in accordance with the invention, the circuit being incorporated in an exemplary printed circuit configuration for providing isolation between a load and a source.

Referring to FIG. 2, a preferred embodiment of an A.C. grounded, broadband termination network formed in microstrip circuit configuration is described. Rf energy is coupled between source 10 and load 12 by a microstrip transmission line 22, 26, and ferrite circulator element 24 formed on the surface of an insulative substrate 20 which may be, for example, a chip of 25 mil aluminum oxide. The opposite surface of the substrate supports a ground plane conductor in conventional fashion. The transmission line includes a circulator element 24 which couples energy in a clockwise direction as indicated by arrow A. That is, an rf signal from source 10 is coupled across the top of the circulator and exits to the load 12 through transmission line segment 26 along the path denoted by arrow B.

Assuming that $R_o \ne R_L$, reflections of rf energy will be generated at the load. The reflections are coupled via the lower half of circulator 24 along a path indicated by arrow C. An A.C. grounded resistive termination network 28 constructed in accordance with the present invention operates as a dummy load which absorbs such reflections and prevents their return to signal source 10. Network 28 comprises a resistive element 30, a conductive segment 32, another resistive element 34 and segments comprising conductive segment 36, resistive element 42 and capacitor 40 in parallel with conductive segment 38, resistive element 42 and capacitor 40. The impedance of this network equals the characteristic impedance of the system and thus effective isolation between the load and the source is achieved.

The resistance values of resistive elements 30 and 34 and the impedance and line length values of conductors 32, 36 and 38 are selected in the manner described below such that the impedance of the network as seen from the transmission line approaches a resistive constant over a multi-octave range of frequencies whereby effective broadband isolation is achieved. For example, the following resistance and conductor parameters provide excellent performance over the 2–8 GHz. frequency band:

Resistor 30 – 74 ohms
Conductor 32 – $\theta = 96°$, $Z = 31.5$ ohms
Resistor 34 – 32 ohms
Conductor 36, 38 – $\theta = 76°$, $Z = 14$ ohms The effective network impedance provided by the above parameter values over the indicated frequency band is 96 ohms. For the conductor segments the line length $\theta$ is given in terms of degrees of the center frequency 5 GHz. (e.g., $90° = \lambda/4$). The Z values denote the characteristic impedance of the conductor segments.

As shown in FIG. 2, the low impedance conductor segment 36, 38 is actually shown as two equal conductor segments connected in parallel. Each of these segments, which branch out at right angles from resistor 34, has a line length of 76° and a characteristic impedance of 28 ohms. Together, they are equivalent to a single large conductor having a line length of 76° and a characteristic impedance of 14 ohms.

A very small printed capacitor element 40 is connected to the end of each of the conductor segments 36 and 38 by a relatively large resistor 42. The latter may, for example, have a value on the order of 150 ohms. The purpose of the R-C elements 40–42 is to eliminate a narrowband unpredictable resonance which would otherwise be present at a frequency for which $\lambda/2$ equals twice the line length of one of the conductor elements 36 or 38. Since the resistors 42 are relatively large and the capacitors 40 are small, the effect of these R-C elements on the performance of the network as expressed in terms of voltage reflection coefficient over the frequency band of interest, is negligible.

Determination of the resistance values of resistors 30 and 34 and of the line lengths and characteristic impedances of conductors 32, 36 and 38 is made by an "exhaustive search" analysis technique which involves calculating the voltage reflection coefficient for the network for a large number of assumed parameter values and selecting the set of parameters that provides the optimum (minimum) worst-case voltage reflection coefficient.

The equation for voltage reflection coefficient is $$\Gamma = \frac{A_E + B_E - C_E - D_E}{A_E + B_E + C_E + D_E} \quad (1)$$

where $A_E$, $B_E$, $C_E$, $D_E$ are the matrix products of the individual ABCD matrices for the resistors and conductor segments of the newtork 28. In the ABCD matrix the values of A, B, C and D for each conductor segment are as follows:

A = cosh $\gamma$ L
B = $Z_o$ sinh $\gamma$ L
C = $1/Z_o$ sinh $\gamma$ L
D = cosh $\gamma$ L The ABCD matrix values for the resistors are as follows:

A = 1
B = resistance value
C = 0
D = 1

In the above $\gamma$ = propogation constant per unit of length = $\alpha + j\beta$
L = line length in mils
$Z_o$ = characteristic impedance The above method of determining $\Gamma$ is known as the "chain matrix" analysis technique and is described in the literature. For example see the text Microwave Filters, Impedance Matching Networks And Coupling Structures by G. Matthaei, L. Young and E. M. T. Jones, McGraw-Hill, 1964, pages 26–28.

Using equation (1) a first frequency response curve for the network is calculated by substituting an initial set of assumed parameters and calculating $\Gamma$ for each of a number of frequency points spread across the band of interest. The number of frequency points selected depends upon the number of peaks and valleys expected to exist in the response curve for the particular frequency band. For example, 20 equally spaced sampling points have been found to be adequate for the frequency band from 2 to 8 GHz.

After a frequency response has been calculated with the initial set of assumed parameters, the parameters are thereafter varied in a systematic fashion, described below, and the results compared. After an optimum set of parameters has been ascertained using the first set of assumed values of resistance, impedance and line length, a second set of assumed resistance, impedance and line length parameters is selected based on the results of the first calculations and the process is repeated. After completion of several iterations of the above computation, comparison and selection steps, the final calculated parameters are known to represent essentially the optimum parameters for the frequency band of interest.

Figure 3:
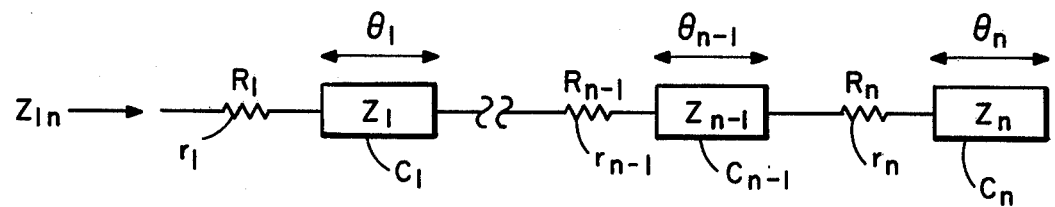
FIG. 3 is a schematic diagram illustrating in general form the equivalent circuit for an A.C. grounded termination network configured in accordance with the invention.

FIG. 3 gives a general model of an A.C. grounded, resistive termination network constructed in accordance with the invention. The network includes a series of alternating resistor and conductor elements $r_1$, $c_1$, $r_{n-1}$, $c_{n-1}$, $r_n$ and $c_n$. The resistance values for the resistors are $R_1$, $R_{n-1}$ and $R_n$, respectively. For the conductor segments the impedance values are $Z_1$, $Z_{n-1}$ and $Z_n$ respectively while the line length parameters are $\theta_1$, $\theta_{n-1}$ and $\theta_n$, respectively.

Referring to FIG. 2, a description is hereinafter given of an example of the specific procedures which may be employed for computation of the optimum parameter values for the distributed element network 28. As previously explained, the network includes a pair of conductor segments 32 and 36, 38 connected together by a resistive element 34, the network being connected to the transmission line by the resistive element 30.

To begin the process of parameter selection, three values are selected for each of the parameters to be varied, i.e., $R_1$ and $R_2$ for resistors 30 and 34, respectively, $Z_1$ and $\theta_1$ for conductor 32 and $Z_2$, $\theta_2$, for conductor 36, 38. For example, the three resistance values for each of the resistors may be set at a center value, an upper value and a lower value where the center value is one half of the effective network impedance desired. That is, if it is desired to have a 96 ohm termination, the center value for $R_1$ and $R_2$ is set at 48 ohms. Upper and lower values for $R_1$ and $R_2$ may be set at ±0.4 of the center value, respectively. Likewise, center, upper and lower values are selected for $Z_1$ and $Z_2$ and for $\theta_1$ and $\theta_2$. The center value for the impedance parameters is set at a normalized value of 1, i.e., equal to the system characteristic impedance. The upper and lower impedance values may be set at ±0.4 of the center value. The center value for $\theta$ may be set at 45° ($\lambda/8$) of the center frequency of the band of interest while the upper and lower $\theta$ values may be set at ±32° from the center, i.e., 77° and 13°, respectively.

Using equation (1), the center value of each of the selected parameters for $R_1$, $R_2$, $Z_1$, $Z_2$, $\theta_1$ and $\theta_2$ are substituted into the equation and a voltage reflection coefficient value is computed for each frequency sample point selected across the frequency band. Next, the low value for $R_1$ is substituted into the equation (while all other parameters are left the same as for the previous computation) and a second frequency response is computed. The $\Gamma$ values obtained from the second computation are compared to those from the first computation and the set with the lowest worst-case value of $\Gamma$ ($\Gamma_{max}$) is retained along with the $\Gamma_{max}$ value. Next, a third computation is run using the higher $R_1$ parameter while the other parameters remain the same as before. Again, a comparison is made against the retained $\Gamma_{max}$ value resultant from the previous computation and the set of parameters yielding the lowest value of $\Gamma_{max}$ is retained along with the associated $\Gamma_{max}$ value.

This process is repeated until every possible combination of the three initially assumed values for $R_1$, $R_2$, $Z_1$, $Z_2$, $\theta_1$ and $\theta_2$ have been substituted into the equation and processed. For the network shown in FIG. 2, the total number of computations required will be $3^6$ since there are six parameters to be varied and each parameter has three possible values.

At the end of this computation — comparison sequence one set of parameters will be retained as yielding the lowest value of $\Gamma_{max}$. Next, using those parameter values as the new center values, a second group of three assumed values as chosen for each of the variable parameters. The upper and lower values for this second set of assumed parameters may, as in the case of the first set of assumed parameters, be varied ±32° for the line length and ±0.4 and for resistance and impedance. Using this second set of assumed parameters, the same process is repeated whereby $\Gamma$ is calculated across the frequency band until the set of parameters yielding the lowest value of $\Gamma_{max}$ is identified. If no set of parameters yields a lower $\Gamma_{max}$ than that produced during the previous set of computations, the next set of computations is run using the same center value parameters and selecting upper and lower values using a narrower deviation. This is, for $\theta$ the upper and lower values can be set at ±16° from the new center value and for R and Z the upper and lower values can be set at ±0.2 from the new center value. Using these parameters another set of $3^6$ computations are run and the set of parameters yielding the lowest value of $\Gamma_{max}$ is retained.

The above described process of selecting resistance, line length and impedance parameters and calculating for optimum $\Gamma$ vs. frequency response can be repeated as many times as desired. However, one practical limitation on the number of computations that can be run is that after several steps of selecting narrower upper and lower parameter limits a point will be reached where the values of the parameters will exceed the tolerance limits of the manufacturing process used for fabricating the resistor and conductor segments on the substrate. It is of no practical value, of course, to refine the parameters beyond that point. The second limitation on the number of computations that can be made is, of course, the extent of the computation facilities and time available to the designer.

Figure 5:
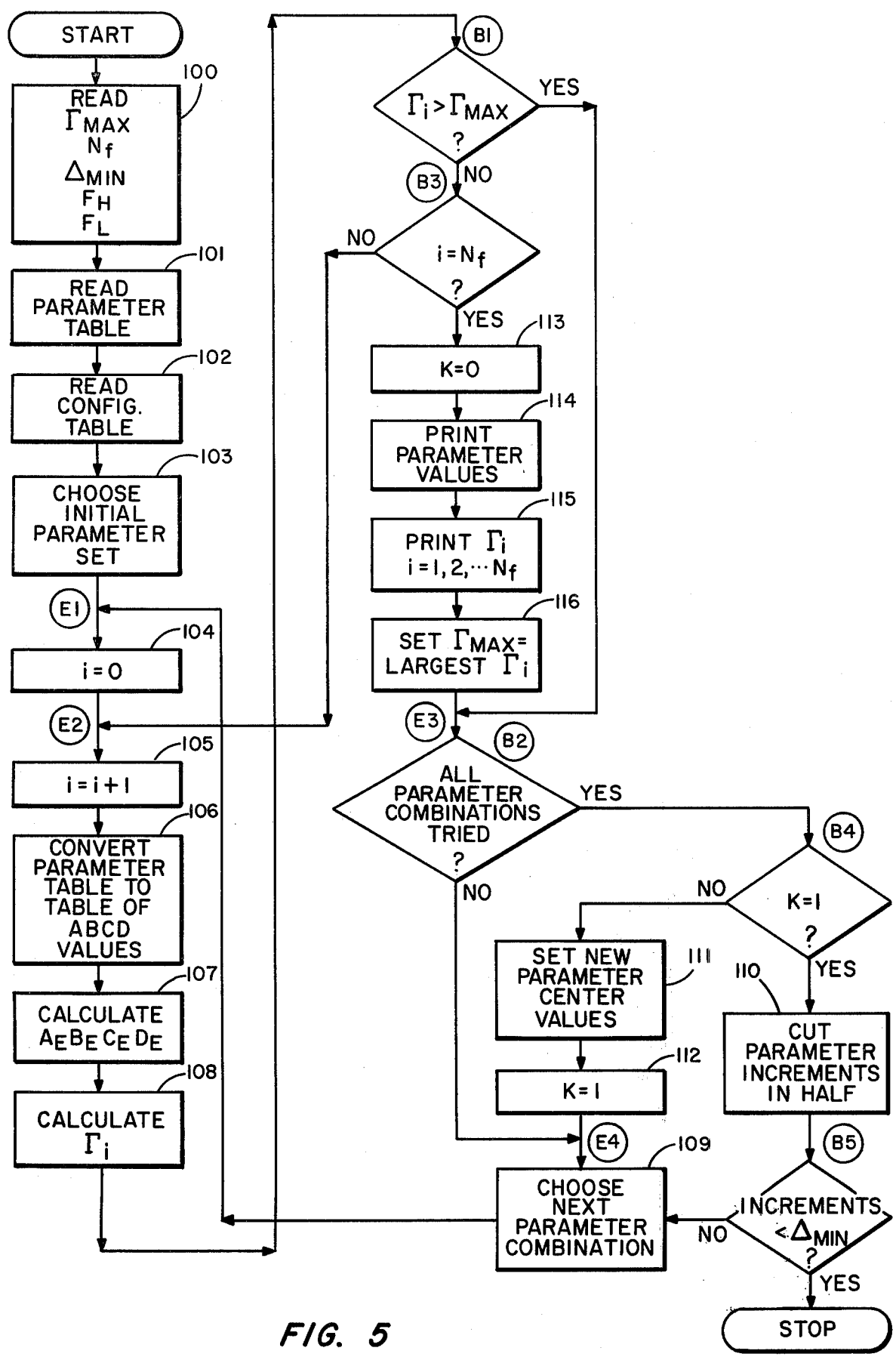
FIG. 5 is a flow diagram illustrating one form of computer program that may be used for controlling the selection of optimum conductor and resistor parameters for the termination network shown in FIG. 2.

Naturally, to do the kind of exhaustive search analysis described above, a computer is required for running the computations of the parameter values and for comparing and retaining the results. An example of a computer program that has been successfully employed is illustrated in FIG. 5 which shows a simplified flow chart for a program that was compiled with FORTRAN and run on a Honeywell 6080 computer. In the diagram, rectangular blocks represent computer operations, and diamond-shaped blocks represent decision branchpoints (labelled with a B prefix). Entry points are labelled with an E prefix.

The first series of operations 100, 101 and 102 consists of reading the required initial data into the computer. $\Gamma_{max}$ is some value of $\Gamma$ set high enough (e.g., one) to insure that all calculated $\Gamma$ values for the initial set of chosen parameters will be less than it. $N_f$ is the number of frequency sample points in the frequency band of interest for which $\Gamma$ values will be calculated and $\Delta$ min is the smallest parameter value increment of interest for each parameter to be optimized (i.e., resistance R, line length $\theta$ and impedance Z). $F_H$ and $F_L$ are, respectively, the high and low frequencies in the frequency band of interest.

The "parameter table" is a collection of input data setting forth the initial conductor and resistor center parameters and the initial $\Delta$ increments to be used to derive the associated upper and lower parameter values. The parameter table further includes data to identify the type of circuit elements in the network and a code designation for each parameter indicating whether or not the parameter is to be varied or held constant during the optimization process. The "configuration table" (operation 102) is a data sequence indicating the order in which the circuit elements are to be considered in the matrix multiplication computation (operation 107) used for determination of $A_E$, $B_E$, $C_E$ and $D_E$.

It is to be understood that the computer already has in storage the necessary subroutines for computing the ABCD matrix products for the different circuit elements and for computing $\Gamma$ (equation 1 above).

After the read-in operations are completed, the computer selects an initial set of parameters for all the circuit elements (FIG. 5, operation 103). While no particular set of initial parameters is required, one convenient set consists of the center values specified in the parameter table. The program then proceeds through entry point E1 to operation 104 where the control variable $i$ is set to zero. Control variable $i$ is used to provide a specific value of $\lambda$ (wavelength). In operation 105 $i$ is incremented to 1, which indicates the first frequency sample point in the frequency band. Thereafter, the program calls out the appropriate subroutines for calculation of the ABCD matrix values for each circuit element (operation 106). Next, in operation 107, the matrix multiplication subroutine is exercised, resulting in calculation of the $A_E$, $B_E$, $C_E$ and $D_E$ values.

Operation 108 is then performed whereupon a value for $\Gamma_i$ is computed using equation (1). Since the control variable $i$ is set at 1 the calculated $\Gamma$ value will be for the first frequency sample point in the frequency band. Next, at branch point B1 $\Gamma_i$ is compared with $\Gamma_{max}$ and if $\Gamma_i$ is smaller (which it must be for the first program cycle) branch point B3 is encountered. If $i$ does not equal $N_f$ the program goes back to entry point E2 where operations 105, 106, 107 and 108 are again performed, resulting in computation of $\Gamma$ for the next frequency sample point in the band. Again, branch points B1 and B3 are traversed in the "NO" direction and the $\Gamma_i$ calculation loop will again repeat. This continues until all values of $\Gamma$ are computed for $i=1$ through $i=N_f$.

After this, branch point B3 is traversed in the "YES" direction and operations 113, 114, 115 and 116 are performed. This results in the setting of the control flag bit K to zero (operation 113) and the printing out of the present R, $\theta$ and Z parameters and all the computed $\Gamma_i$ values. After that, $\Gamma_{max}$ is reset to be equal to the largest value of $\Gamma_i$ just calculated (operation 116).

The program then proceeds through branch point B2 in the "NO" direction and performs operation 109 whereupon one of the parameter values for one of the circuit elements is changed to set up a new combination of parameters. The program then moves to entry point E1 whereupon a new $\Gamma_i$ computation cycle is begun. The process of setting up new parameter combinations in operation 109 may be controlled for example, through use of a "nested DO loop" routine which sequentially runs through the $3^6$ different parameter combinations for each parameter set.

During the next $\Gamma_i$ computation cycle, as well as in all succeeding $\Gamma_i$ computation cycles, branch point B1 acts to automatically "throw out" any parameter combination which yields a $\Gamma_i$ value lower than $\Gamma_{max}$. That is, B1 is traversed in the "YES" direction if $\Gamma_i$ is less than $\Gamma_{max}$ whereupon the program proceeds directly to branch point B2 and thence to operation 109 where a new parameter combination is chosen and a new $\Gamma_i$ computation cycle is begun. However, for any parameter combination which produces $\Gamma_i$ values which are all less than $\Gamma_{max}$, the $\Gamma_i$ computation cycle will be completed through to $N_f$ and thereafter the program will proceed through branch-point B3 to operations 113, 114, 115 and 116. The result is that the last parameter combination to be printed out is always the best parameter combination encountered up to that point.

When all combinations of a given set of parameters have been tried, branch point B2 is traversed in the "YES" direction and the program will either set up a new set of parameter center values (operation 111) or set up a narrower set of upper and lower parameter selection increments (operation 110), depending on the value of flag bit K. K is initially set at 0 in operation 113. After the initial set of parameters is exhausted, branch point B4 is traversed in the "NO" direction so that operation 111 is selected. This sets up a new set of parameter center values equal to those values stored in the print readout registers (re operation 114). As previously mentioned, those stored parameter values, being the last ones printed out during the preceding $\Gamma_i$ computation cycle, are the best parameter values discovered to that point.

Thus, the next series of $\Gamma_i$ computation cycles will be carried out using the best previously discovered set of parameters as the new center values and using the same upper and lower parameter selection increments as before (i.e., ±32° for $\theta$ and ±0.4 for Z and R). Flag bit K is set to 1 in operation 112 following selection of the new parameter values.

However, if the program runs through an entire parameter set ($3^6$ $\Gamma_i$ computation cycles) without ever traversing branch point B1 in the "NO" direction, branch point B4 will be traversed in the "YES" direction. This selects operation 110 such that the previous parameter center values are retained but the parameter increments are cut in half so that the upper and lower parameter values are drawn in closer to their associated center values.

After that, branch point B5 is traversed in the "NO" direction and the ensuing $\Gamma_i$ computation cycles will result in a finer resolution of the parameter selection process due to the use of the narrower parameter upper and lower selection increments. After the program has run through operation 110 several times, the parameter values will have been "honed" to the point where an additional halving of the upper and lower selection increments will result in parameter values which cannot be achieved in the manufacturing process used for plating the conductor segments. When this occurs the $\Delta_{min}$ limit is exceeded and branch point B5 will be traversed in the "YES" direction. This terminates the program.

The parameter values last printed out in operation 114 are the optimum parameters for the frequency band specified.

A substantial computer time savings can be realized if the $\Gamma_i$ computation cycles are processed by running through the most "suspect" frequency sample points first. That is, the circuit designer should be able to predict which frequency points are likely to exhibit degraded performance. This most often is true of frequency points near the band edges. If these points are calculated at the beginning of the computation cycle for each parameter combination, rejection of unsatisfactory combinations at branch point B1 will take place sooner so that aggregate computer time is reduced.

Figure 4:
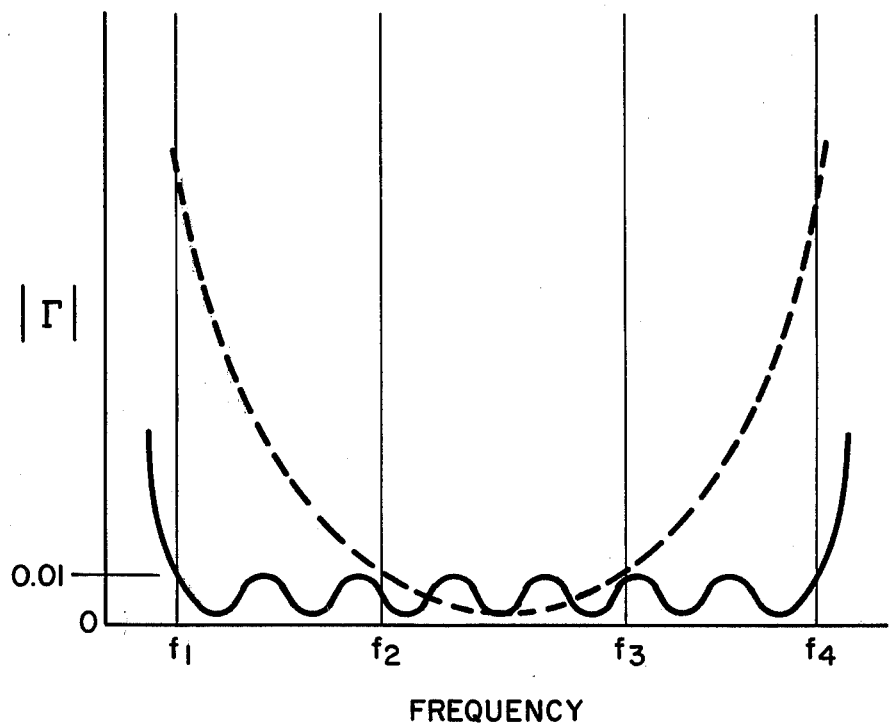
FIG. 4 is a graph showing a plot of voltage reflection coefficient as a function of frequency for the termination network of FIG. 2.

Referring to FIG. 4 a typical $\Gamma$ - frequency response curve for a set of optimum parameter values is shown by the solid curve and the dashed curve represents the frequency response before the optimum set of circuit parameters has been determined. It is noted that the maximum $\Gamma$ value across the broad frequency band $f_1$-$f_4$ is below the value 0.01 for the solid curve and this is within acceptable limits.

The above description of the computation procedures and computer program steps required for obtaining an optimum set of circuit parameters is not necessarily the only computation method or program that can be used. It is, however, considered by the inventor as the preferred procedure as of the time of filing the present application. For example, instead of comparing the computation results on a worst-case basis, the sum of all values could be used. That is, since it is known that the best frequency response is a voltage reflection coefficient of 0 for all frequency points across the band, the comparison routine could simply select the set of parameters which yielded the minimum sum of $\Gamma$ values. However, this procedure does not necessarily guarantee that all of the peaks (see FIG. 4) running across the $\Gamma$ - frequency response curve will be within a given limit. For example, the set of parameters yielding the minimum sum of $\Gamma$ values might include several very small ripples in the curve and one or two large peaks extending above the acceptable $\Gamma$ limit. However the "worst-case" comparison technique described hereinabove eliminates this possibility and assures circuit performance within a predetermined set of limits.

While the model shown in FIG. 3 illustrates an alternating resistor-conductor series, it is not necessary that the series begin with a resistor. However, the series must end with a conductor since a resistor element in that position would be superfluous and have no impact on the effective impedance of the network. Also, the resistor-capacitor pairs 40, 42 shown in FIG. 2 need not necessarily be tacked on the end of the network but may be included in the model (FIG. 3) and integrated through the above-described computation process into the complete network. However, as previously mentioned this is not really necessary since the resistors 42 have relatively large values and the capacitor elements 40 are very small whereupon the effect of the R-C pairs on the overall network impedance is negligible.

It will be appreciated that various changes in the form and details of the above described preferred embodiment may be effected by persons of ordinary skill without departing from the true spirit and scope of the invention.

I claim:

1. An rf printed circuit A.C. grounded, resistive termination network for operation over a range of frequencies comprising, in combination:
   a printed A.C. grounded rf transmission line supported on an insulative substrate for coupling an rf signal between an rf source and a load, said printed transmission line including a ferite circulator element connected between the rf source and the load, and
   a distributed element network connected to said line and including a plurality of discrete resistive and a plurality of conductive segments interconnected in an alternating resistance-conductance series, said resistive and conductive segments comprising at least one resistive and one conductive segment connected in series between said ferite circulator element and one junction of a parallel combination, each of the branches of said parallel combination comprising a resistive segment and a conductive segment connected in series with a grounded capacitor, the line length and impedance values of said conductive segments and the resistance values of said resistive segments being selected to minimize the voltage reflection coefficient for said network over the frequency range of said signal.

2. An rf printed circuit, A.C. grounded, resistive termination network for operation over a range of frequencies comprising, in combination:
   a printed A.C. grounded rf transmission line supported on an insulative substrate for coupling an rf signal between an rf source and a load, said printed transmission line including a ferite circulator element connected between the rf source and the load; and
   a distributed element network connected to said line and including a plurality of discrete resistive and a plurality of conductive segments interconnected in an alternating resistance-conductance series, said resistive and conductive segments comprising at least one resistive and one conductive segment connected in series between said ferite circulator element and one junction of a parallel combination, each of the branches of said parallel combination comprising a resistive segment and a conductive segment connected in series with a grounded capacitor, the line length and impedance values of said conductive segments and the resistance values of said resistive segments being selected such that the impedance of said network as seen from said transmission line is approximately a resistive constant over the frequency range of said signal.

* * * * *